(12) United States Patent
Shin (10) Patent No.: US 7,488,634 B2
(45) Date of Patent: Feb. 10, 2009

(54) METHOD FOR FABRICATING FLASH MEMORY DEVICE

(75) Inventor: Eun Jong Shin, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 378 days.

(21) Appl. No.: 11/121,465

(22) Filed: May 3, 2005

(65) Prior Publication Data

US 2005/0245037 A1    Nov. 3, 2005

(30) Foreign Application Priority Data

May 3, 2004    (KR) .................. 10-2004-0031011

(51) Int. Cl.
*H01L 21/336* (2006.01)
(52) U.S. Cl. .................. 438/183; 438/142; 438/159; 438/161; 438/201; 438/926; 257/411; 257/E21.334; 257/E21.453
(58) Field of Classification Search .................. 438/142, 438/149, 153, 159, 161, 163, 201, 217, 926, 438/183; 257/E21.334–E21.346, E21.453, 257/E21.473, E21.625, E21.639, 324, 410, 257/411, E29.132–E29.138, E29.162–E29.165
See application file for complete search history.

(56) References Cited

U.S. PATENT DOCUMENTS

| | | | | |
|---|---|---|---|---|
| 6,043,164 | A | * | 3/2000 | Nguyen et al. .............. 438/736 |
| 6,051,487 | A | * | 4/2000 | Gardner et al. ............. 438/585 |
| 6,512,273 | B1 | * | 1/2003 | Krivokapic et al. ......... 257/369 |
| 6,524,913 | B1 | * | 2/2003 | Lin et al. .................... 438/261 |
| 6,674,132 | B2 | * | 1/2004 | Willer ........................ 257/390 |
| 6,847,080 | B2 | * | 1/2005 | Komori et al. .............. 257/344 |
| 2004/0157451 | A1 | * | 8/2004 | Koh ........................... 438/690 |
| 2004/0188766 | A1 | * | 9/2004 | Narasimha et al. .......... 257/368 |

\* cited by examiner

*Primary Examiner*—Carl Whitehead, Jr.
*Assistant Examiner*—Maliheh Malek
(74) *Attorney, Agent, or Firm*—Andrew D. Fortney (57) ABSTRACT

A method for fabricating a flash memory device is disclosed that improves hot carrier injection efficiency by forming a gate after forming source and drain implants using a sacrificial insulating layer pattern, which includes forming a sacrificial insulating pattern layer over a flash memory channel region of a semiconductor substrate; forming source and drain regions in the semiconductor substrate by ion implantation using the sacrificial insulating pattern layer as a mask; removing portions of the sacrificial insulating pattern layer; sequentially forming an ONO-type dielectric layer and a gate material layer; selectively etching the gate material layer and at least part of the gate dielectric layer to form a gate; and forming gate sidewall spacers at sides of the gate.

26 Claims, 8 Drawing Sheets

METHOD FOR FABRICATING FLASH MEMORY DEVICE

CROSS-REFERENCE TO RELATED APPLICATIONS

This application claims the benefit of Korean Application No. P2004-31011, filed on May 3, 2004, which is hereby incorporated by reference as if fully set forth herein.

BACKGROUND OF THE INVENTION

1. Field of the Invention

The present invention relates to a semiconductor memory device, and more particularly, to a method for fabricating a flash memory device that improves hot carrier injection efficiency by forming a gate after forming source and drain implants using a sacrificial insulating layer pattern.

2. Discussion of the Related Art

Recently, flash memory devices in common use have been classified into a stacked gate flash cell type and an SONOS (polysilicon-oxide-nitride-oxide-semiconductor) flash cell type. The stacked gate flash cell type has a stack structure including a floating gate and a control gate. The SONOS flash cell type comprises an ONO (oxide-nitride-oxide) gate dielectric and a single gate.

In the stacked gate flash cell type device, a turn-on threshold voltage Vth of the control gate is shifted by a local electric field induced by a hot carrier injected into the floating gate. Programming and erasing functions in the device are based in part on these phenomena.

In the SONOS-type flash memory device, an interface between an oxide layer and a nitride layer in the ONO gate dielectric and an injected hot carrier trap in a defect site of the nitride layer function similarly to the floating gate of the flash memory device having the stacked gate flash cell type.

To improve the operation characteristics of the flash memory device, one should optimize or maximize the hot carrier injection efficiency for programming in the device. Especially, as low power consumption devices are actively researched and developed, the device characteristics for maximizing the hot carrier injection efficiency become more important.

Accordingly, a nonvolatile memory device of the SONOS cell type has attracted great attention in that it can overcome many problems in other nonvolatile memory devices of various cell types.

In the SONOS-type nonvolatile memory device, the top oxide layer functions as a potential barrier for electric charges (e.g., a "gate oxide"). In addition, a new memory trap of high density may be generated at the interface between the top oxide layer and the nitride layer. Accordingly, while maintaining a relatively constant size of a memory window, it is possible to thin a gate insulating layer, specifically, the nitride layer, thereby obtaining a high-efficiency nonvolatile memory device having a programmable voltage for programming and erasing and low power consumption.

Hereinafter, a method for fabricating a flash memory device according to the related art will be described with reference to the accompanying drawings.

FIG. 1A to FIG. 1H are cross sectional views of illustrating the process for fabricating an SONOS type flash memory device according to the related art.

Figure 1A:
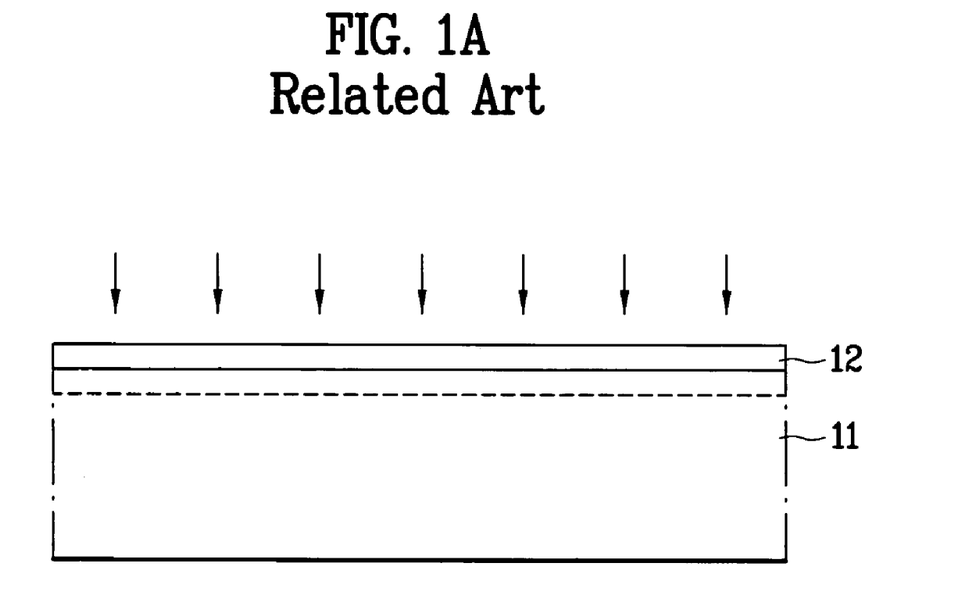
FIG. 1A to FIG. 1H are cross sectional views of illustrating the process for fabricating an SONOS type flash memory device according to the related art.

As shown in FIG. 1A, a buffer oxide layer 12 is formed on a mono-crystalline silicon substrate 11. Then, an ion implantation process is performed to form a well in the surface of the semiconductor substrate 11, and a channel ion implantation process for controlling a threshold voltage is performed.

Figure 1B:
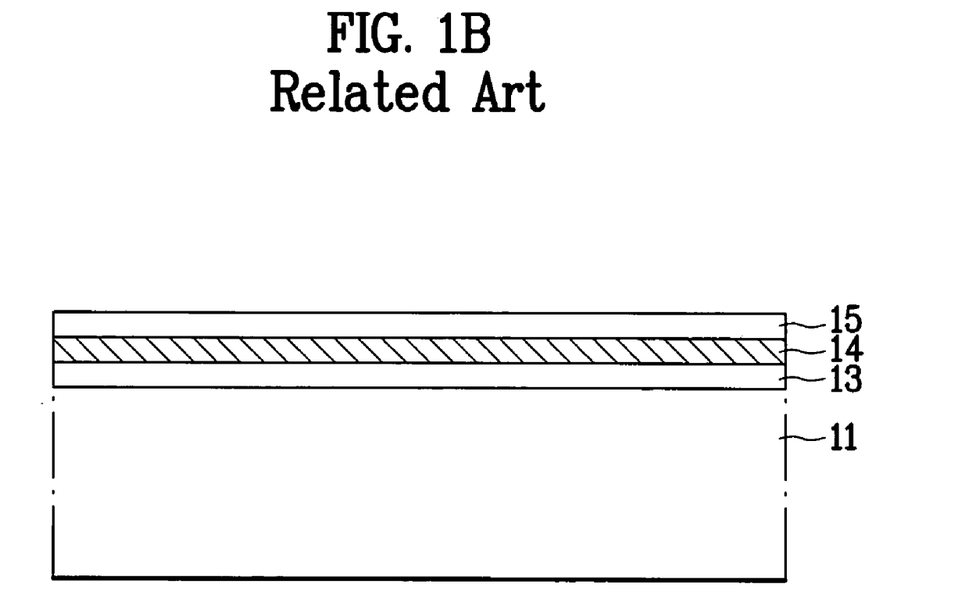

Referring to FIG. 1B, after removing the buffer oxide layer 12, a bottom oxide layer 13 is formed at a thickness between 50 Å and 80 Å on the surface of the semiconductor substrate 11 by LPCVD (low pressure chemical vapor deposition).

Subsequently, a trap nitride layer 14 is stacked on the bottom oxide layer 13 at a thickness between 100 Å and 150 Å by LPCVD. Also, a top oxide layer 15 is grown or otherwise formed on the trap nitride layer 14, wherein the top oxide layer 15 is formed at a thickness between 250 Å and 300 Å by FTP (furnace thermal process).

Figure 1C:
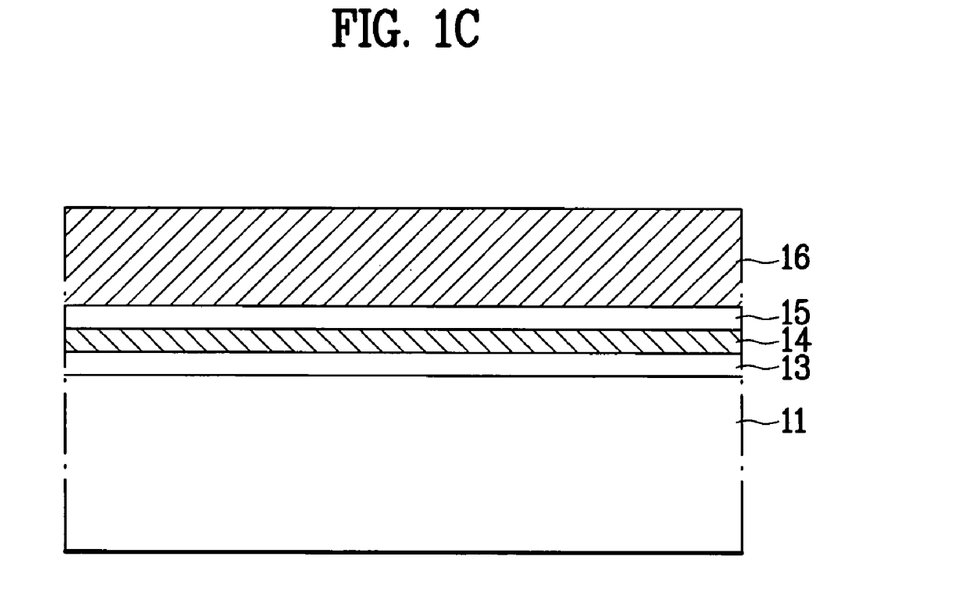

As shown in FIG. 1C, a conductive material for forming a gate, for example, a polysilicon layer 16 is formed on the top oxide layer 15 at a thickness between 2500 Å and 3000 Å by LPCVD.

Figure 1D:
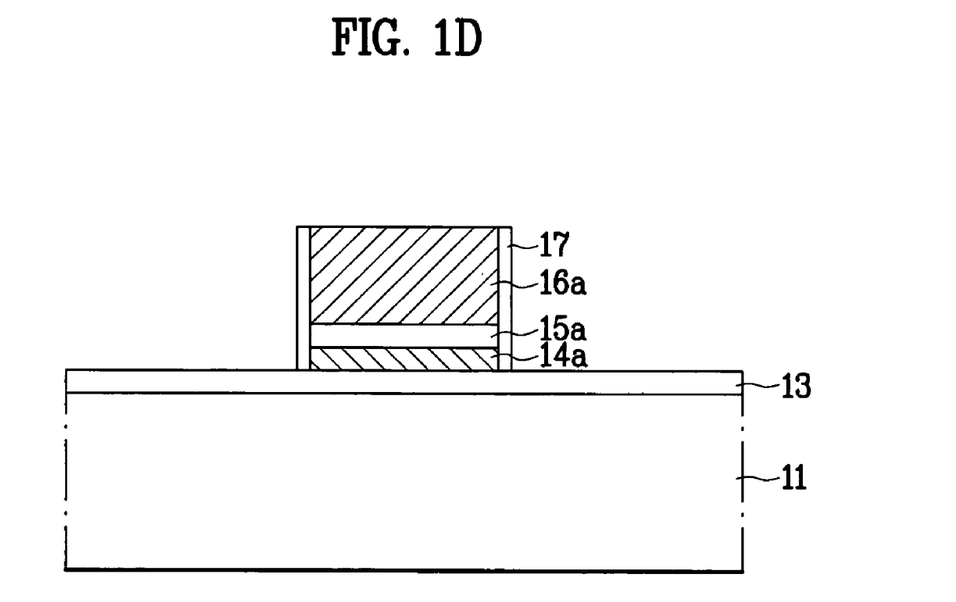

As shown in FIG. 1D, the polysilicon layer 16, the top oxide layer 15 and the trap nitride layer 14 are selectively removed by photolithography and RIE (reactive ion etching), thereby forming a gate structure stacking a trap nitride pattern layer 14a, a top oxide pattern layer 15a and a polysilicon pattern layer 16a. Then, a sidewall oxide layer 17 is formed at the side of the trap nitride pattern layer 14a, the top oxide pattern layer 15a and the polysilicon pattern layer 16a.

Figure 1E:
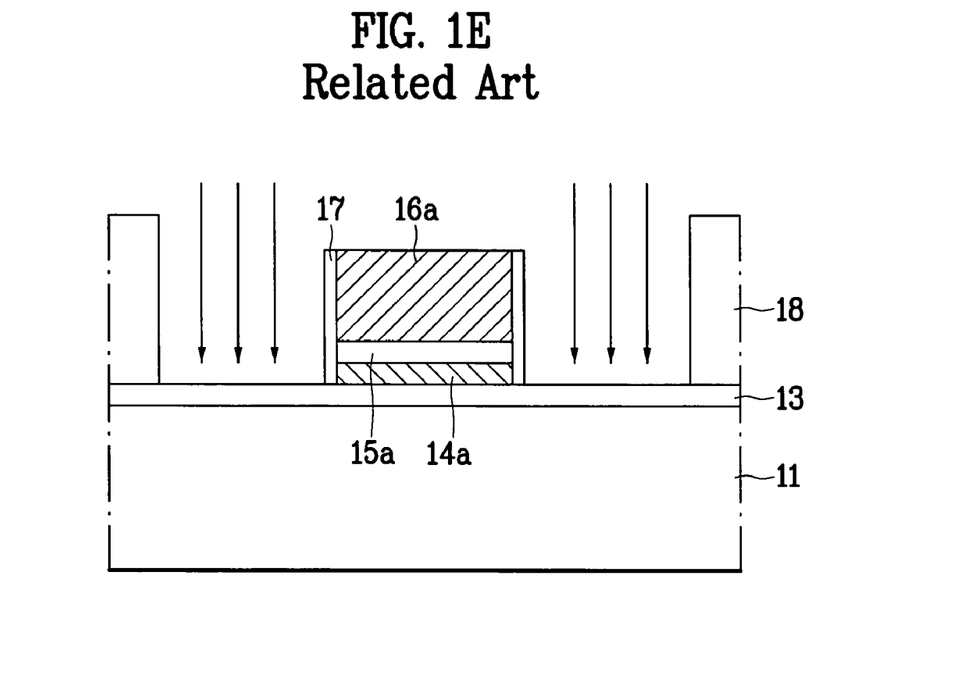

As shown in FIG. 1E, a photoresist layer is coated on an entire surface of the semiconductor substrate 11, and then an exposure and development process is performed thereon, thereby defining source and drain regions in the flash memory device. After that, impurity ions are implanted into the surface of the exposed semiconductor substrate 11 in a relatively low concentration and at a relatively low energy.

Figure 1F:
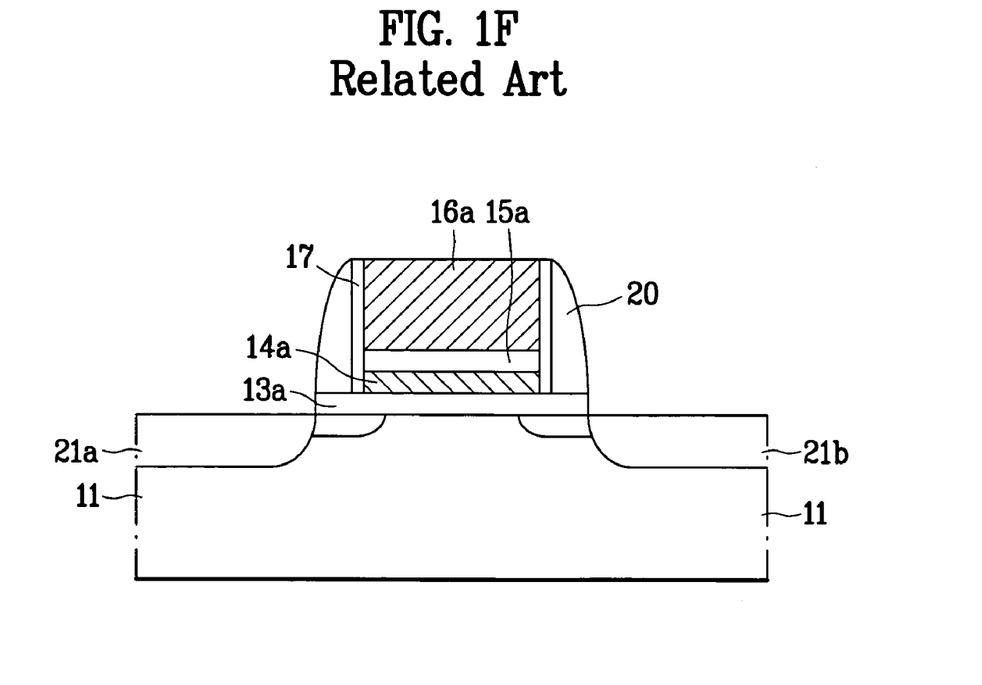

As shown in FIG. 1F, after implanting the low energy impurity ions, a RTP (rapid thermal process) is performed to form an LDD region 19 and activate the impurity ions. Then, an insulating layer is deposited on the entire surface of the semiconductor substrate 11 and etched back to form a sidewall spacer 20 at the side of the gate.

Subsequently, impurity ions are implanted to the semiconductor substrate 11 in a relatively high concentration and at a relatively high energy, using the sidewall spacer 20 as a mask, thereby forming source and drain regions 21a and 21b. Also, the bottom oxide layer 13 is patterned in alignment with the sidewall spacer 20, thereby forming a tunnel oxide pattern layer 13a.

Figure 1G:
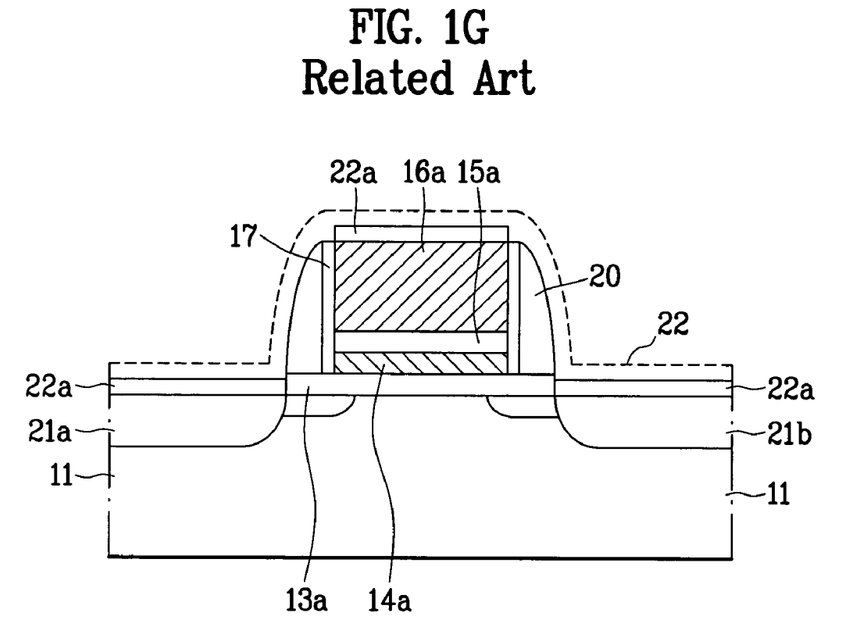

As shown in FIG. 1G, a refractory metal layer (for example, cobalt [Co]) 22 is formed on the entire surface of the semiconductor substrate 11, and then a thermal process is performed, whereby the refractory metal layer reacts with the exposed silicon, thereby forming a silicide layer 22a on the surface of the polysilicon pattern layer 16a and on the surface of the source and drain regions 21a and 21b of the semiconductor substrate 11. Then, the non-reacted refractory metal is removed.

Figure 1H:
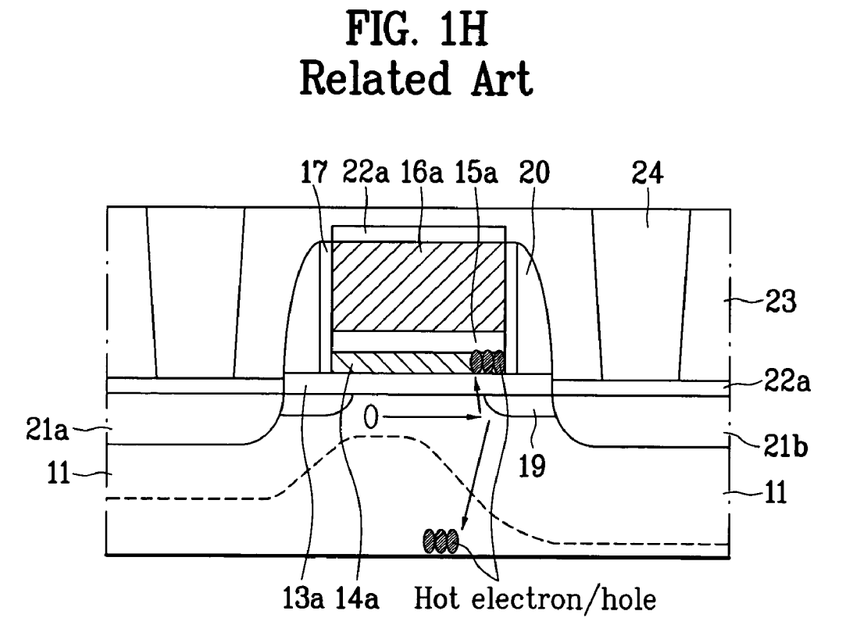

As shown in FIG. 1H, an insulating interlayer 23 is formed on the entire surface of the semiconductor substrate 11, and contacts are formed, resulting in plugs 24 for subsequent contact with a metal line.

However, the method for fabricating the flash memory device of the SONOS structure according to the related art has the following disadvantages.

The ion implantation process for forming the source and drain regions using the gate as the mask is performed after forming the gate. As a result, the gate does not overlap with the drain region sufficiently to improve, optimize or maximize the hot carrier injection efficiency at a low power.

Also, because of certain structural problems, it can be difficult to obtain flash memory devices having a size below sub-micron (e.g., less than 0.15 μm, 130 nm, etc.). Furthermore, it can be difficult to improve the programming and erasing speed in the flash memory device.

SUMMARY OF THE INVENTION

Accordingly, the present invention is directed to a method for fabricating a flash memory device that substantially obviates one or more problems due to limitations and disadvantages of the related art.

An object of the present invention is to provide a method for fabricating a flash memory device that improves hot carrier injection efficiency by forming a gate after forming source and drain implants using a sacrificial insulating layer pattern.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a flash memory device includes the steps of forming a sacrificial insulating pattern layer corresponding to a flash memory channel region of a semiconductor substrate; forming source and drain regions in the semiconductor substrate by ion implantation using the sacrificial insulating pattern layer as a mask; removing the sacrificial insulating pattern layer; sequentially forming a gate dielectric layer and a gate material layer, the gate dielectric layer comprising an ONO structure; forming a gate in the channel region by selectively etching the gate material layer and at least part of the gate dielectric layer; and forming a gate sidewall spacer at the side of the gate.

In one embodiment, the respective steps of forming the sacrificial insulating pattern layer and forming the gate use the same mask.

In another embodiment, the step of forming the sacrificial insulating pattern layer includes the steps of depositing an compound-type oxide layer at a thickness of from 2500 Å and 3000 Å by LPCVD; and selectively removing the portions of the compound-type oxide layer such that the sacrificial insulating pattern layer remains on the channel region.

Also, the sacrificial insulating pattern layer may have a margin of 0.015~0.005 μm/side relative to the gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a flash memory device according to the present invention will be described with reference to the accompanying drawings.

FIG. 2A to FIG. 2F are cross sectional views of illustrating the process for fabricating an SONOS type flash memory device according to the present invention.

In a method for fabricating a flash memory device having an SONOS structure according to the present invention, an ion implantation process for forming LDD, source and drain regions is first performed with a sacrificial insulating pattern layer, and then a process for forming a gate dielectric stack structure and a gate is performed, so that it is possible to increase, optimize or maximize the overlap between the gate and the drain region and improve hot carrier injection efficiency.

A method for fabricating a flash memory device according to the present invention will be described as follows.

Figure 2A:
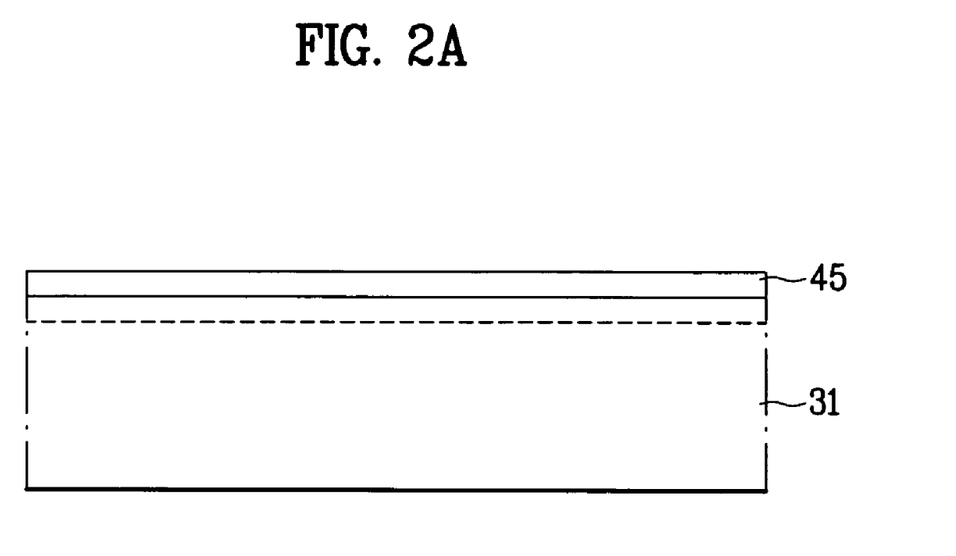
FIG. 2A to FIG. 2H are cross sectional views of illustrating the process for fabricating an SONOS type flash memory device according to the present invention.

As shown in FIG. 2A, a buffer oxide layer 45 is stacked on a mono-crystalline semiconductor substrate 31. Then, a well is formed in the surface of the semiconductor substrate 31 by ion implantation, and a channel ion implantation process for controlling a threshold voltage is performed. After that, the buffer oxide layer 45 is removed.

Figure 2B:
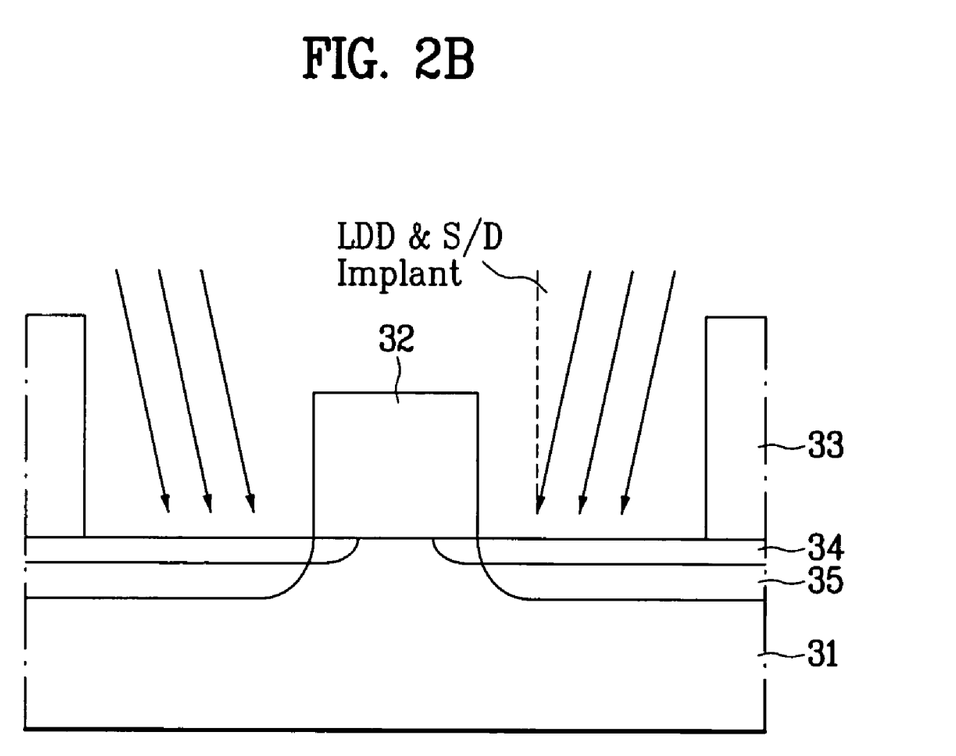

Referring to FIG. 2B, a compound-type oxide layer, for example, TEOS (Tetra-Ethyl-Ortho-Silicate), is deposited on the surface of the semiconductor substrate 31 (to form a sacrificial insulating layer), and then selectively patterned to form a sacrificial insulating pattern layer 32. Alternatively, the sacrificial insulating layer may be formed from inorganic oxide precursors, such as a silane (e.g., of the formula $Si_xH_yX_z$, where x is an integer of from 1 to 4 [typically 1], $y+z=2x+2$, and X is a halogen [e.g., F, Cl, Br or I; typically, Cl]) and an oxygen atom source (such as oxygen gas, ozone, water, CO, $CO_2$, NO, $N_2O$, etc. [typically, oxygen gas]). At this time, the sacrificial insulating pattern layer 32 remains on the channel region portion corresponding to a gate.

When the sacrificial insulating pattern layer 32 functions as a mask for the ion implantation process for forming the LDD, source and drain regions, the sacrificial insulating pattern layer 32 may have a thickness of from 2500 Å to 3000 Å. When the sacrificial insulating pattern layer 32 comprises a compound-type oxide layer, patterning may comprise photolithography and RIE (Reactive Ion Etching) using an etchant mixture comprising $O_2/Cl_2$.

When patterning the sacrificial insulating layer, the same photo mask may be used as that for patterning the gate. The design rules for the gate layer include a margin of 0.015~0.005 μm/side of the gate. Use of the same mask for patterning the sacrificial insulating layer and the gate may reduce the margin for the gate layer design rules, relative to margins associated with layers having substantially identical dimensions, but formed from two separate masks. This condition (or design rule) helps to optimize or maximize the overlap between the gate and the LDD, source and drain regions after forming the gate. Accordingly, there is no additional fabrication cost for the photo mask when patterning the TEOS.

Subsequently, a photoresist layer may be coated on an entire surface of the semiconductor substrate 31, and then selectively patterned to define the LDD, source and drain implant regions. Alternatively, the sacrificial insulating pattern layer 32 may be patterned to define the LDD, source and drain implant regions. After performing a first ion implantation for the LDD region and a second ion implantation for the source and drain regions (both using the patterned photoresist layer 33 as a mask), an ion implant activation process is performed.

The LDD ion implantation process and the source and drain impurity ion implantation process will be described in detail.

First, in the LDD ion implantation process, impurity ions are tilt-implanted to the semiconductor substrate 31 using the sacrificial insulating pattern layer 32 as a mask. At this time, the ion implantation energy and impurity ion density are relatively low, and the implantation angle may be from about 7° to about 45°, or other implant angle known to those skilled in the art to be useful for formation of LDD regions.

In the source and drain impurity ion implantation process, impurity ions are vertically implanted to the semiconductor substrate 31, wherein the ion implantation energy and impurity ion density are relatively high.

After completing the ion implantation process, the implanted ions are activated (generally by conventional annealing), thereby forming the LDD region 34 and the source and drain regions 35.

In FIG. 2B, first, only impurity ions for the LDD region may be implanted without implantation of the impurity ions for the source and drain regions. Then, after patterning the sacrificial insulating pattern layer 32, the impurity ions for the source and drain regions may be implanted using the sacrificial insulating pattern layer 32 as a mask.

Figure 2C:
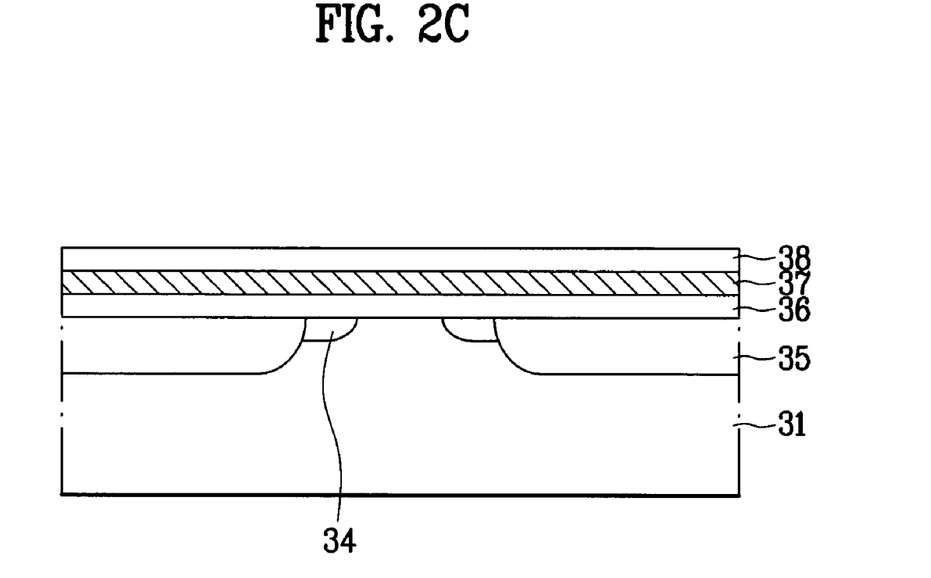

As shown in FIG. 2C, the sacrificial insulating pattern layer 32 and the photoresist pattern layer 33 are removed by etching (e.g., a conventional wet etch process). Then, a bottom oxide layer 36 having a thickness of from 50 Å to 80 Å is formed on the surface of the semiconductor substrate 31 (including the LDD region 34 and the source and drain regions 35) by LPCVD.

Subsequently, a trap nitride layer 37 is formed on the bottom oxide layer 36, generally by LPCVD. The trap nitride layer 37 may have a thickness of from 100 Å to 150 Å. Then, the trap nitride layer 37 is heated (e.g., by a Furnace Thermal Process [FTP] using a furnace) at a temperature between 800° C. and 850° C. in the presence of oxygen or an oxygen atom source, whereby a top oxide layer 38 grows or is otherwise formed to a thickness of from 250 Å to 300 Å. An interface between the trap nitride layer 37 and an oxide layer functions as a "floating gate," or storage layer, in the SONOS-type nonvolatile memory device.

Figure 2D:
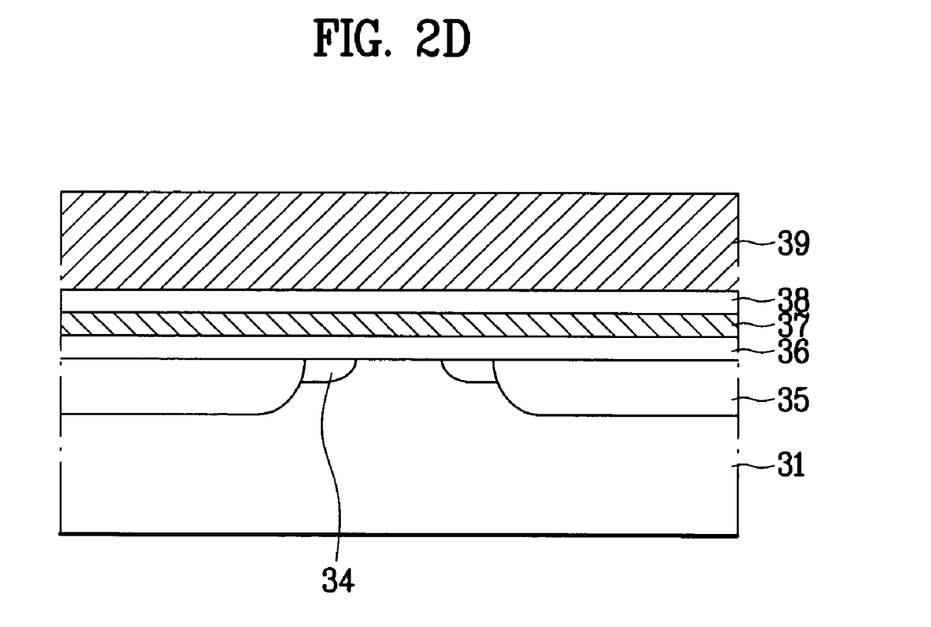

As shown in FIG. 2D, a conductive material layer, for example, a polysilicon layer 39 (which may be doped or heavily doped), is formed on the top oxide layer 38 (generally by LPCVD) for formation of the gate. The conductive material layer 39 may have a thickness of from 2500 Å to 3000Å.

Figure 2E:
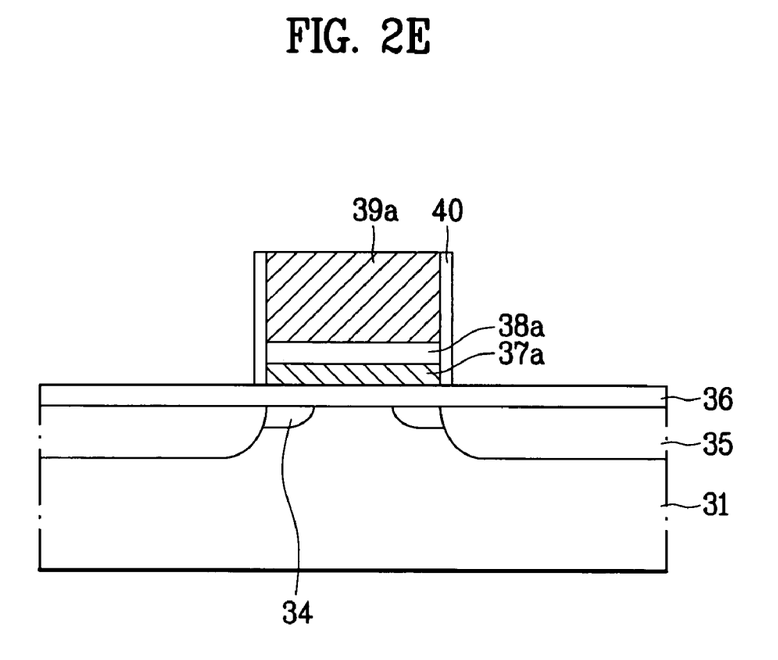

As shown in FIG. 2E, the polysilicon layer 39, the top oxide layer 38 and the trap nitride layer 37 are selectively patterned by photolithography and RIE (Reactive Ion Etching), thereby forming a stacked gate structure comprising a trap nitride pattern layer 37a, a top oxide pattern layer 38a and a polysilicon pattern layer 39a.

Then, a gate sidewall oxidation process is performed to form a gate side oxide layer 40.

At this time, when performing the LDD ion implantation process as shown in FIG. 2B, it is possible to form the source and drain regions 35 using the stacked gate structure comprising the trap nitride pattern layer 37a, the top oxide pattern layer 38a and the polysilicon pattern layer 39a as a mask.

Figure 2F:
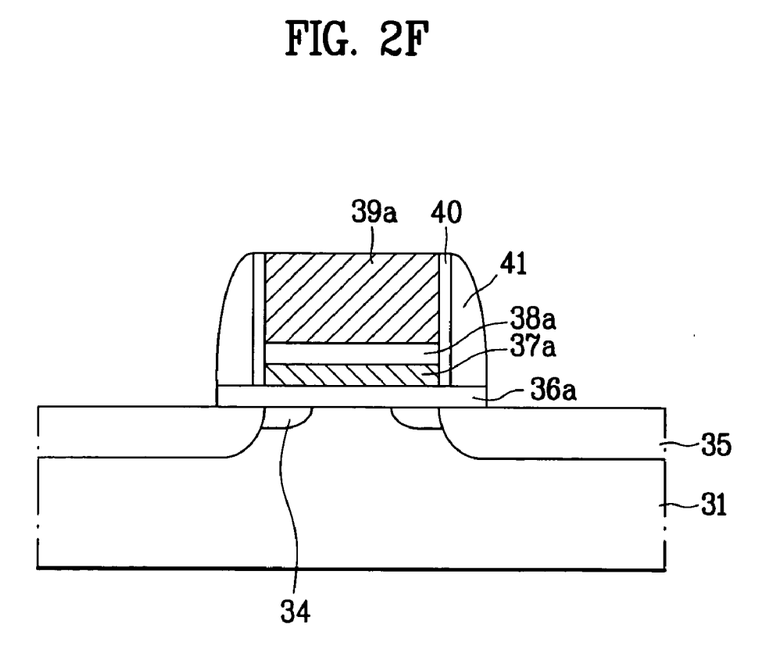

As shown in FIG. 2F, oxide (e.g., TEOS, or Tetra-Ethyl-Ortho-Silicate) and/or nitride layers (preferably an oxide-over-nitride stack) may be formed on the entire surface of the semiconductor substrate 31 by LPCVD, and then etched back (e.g., isotropically etched) to form a gate sidewall spacer 41. After that, the bottom oxide layer 36 is patterned using the gate structure and the gate sidewall spacer 41 as a mask, thereby forming a bottom oxide pattern layer 36a.

Figure 2G:
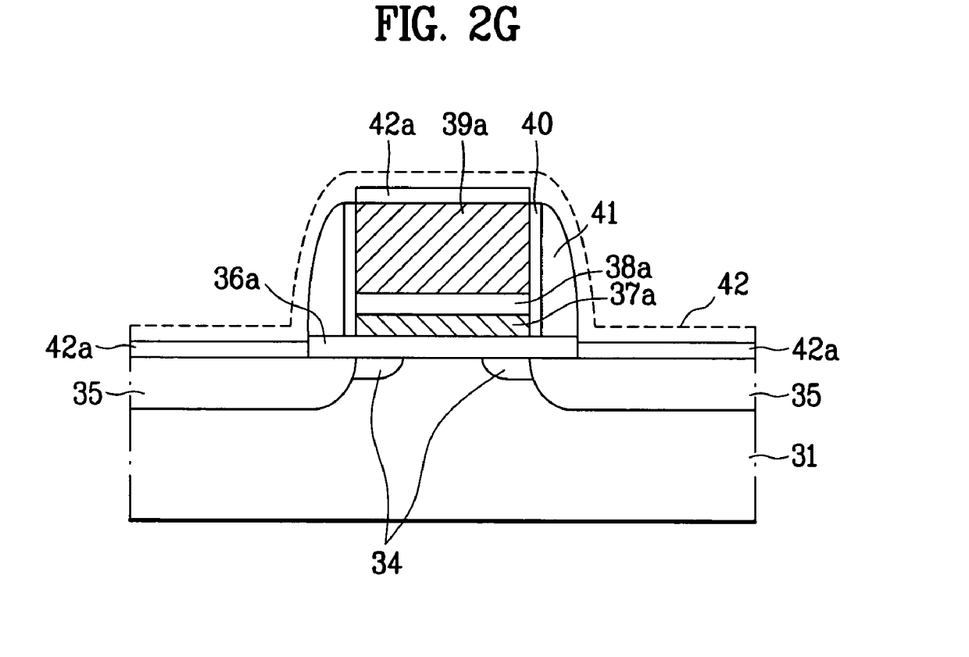

As shown in FIG. 2G, a refractory metal layer 42 (for example, a layer comprising cobalt, titanium, molybdenum or tungsten; preferably cobalt) may be formed on the entire surface of the semiconductor substrate 31, and then a thermal silicidation process is performed thereto. Accordingly, the refractory metal layer reacts with the exposed silicon, whereby a silicide layer 42a is formed on the surface of the polysilicon pattern layer 39a and the surface of the source and drain regions 35 of the semiconductor substrate 31. Then, the non-reacted refractory metal layer 42 is removed.

Figure 2H:
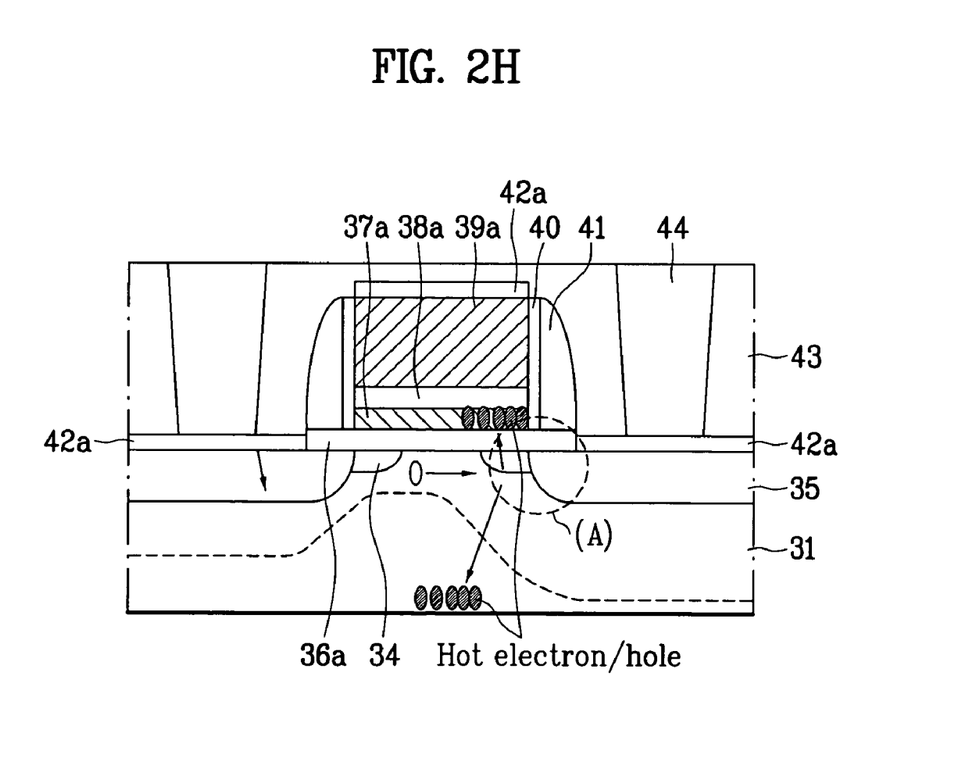

As shown in FIG. 2H, an insulating interlayer 43 may be formed on the entire surface of the semiconductor substrate 31, and contacts formed therein, thereby forming plugs 44 for contact with a subsequently fabricated metal line.

In the method for fabricating a low power SONOS flash memory device according to the present invention, the sacrificial insulating pattern layer may be formed on a channel region using the same photo mask for forming the gate, and ion implantation to form the LDD region and the source and drain regions is performed, thereby optimizing or maximizing the overlapped portions of the gate and the drain region, as shown in the circle (A) of FIG. 2H. The increase in the overlap between the gate and the drain region enables improvement of hot carrier injection efficiency at a low power.

As mentioned above, the method for fabricating the flash memory device according to the present invention has the following advantages.

First, before forming the gate, the LDD region and the source and drain regions are formed to eliminate or at least reduce the design rule margin limits for the overlapped portion(s) of the gate and the LDD and drain regions. Accordingly, it is possible to increase the design margin in high-density, sub-micron flash memory devices.

Also, patterning the sacrificial insulating pattern layer may use the same photo mask as that used for forming the gate. Accordingly, there is no requirement for an additional photo mask for increasing the overlap between the gate and the LDD and drain regions, thereby improving performance while maintaining the fabrication cost.

Also, it is possible to optimize or maximize the overlap between the gate and the LDD and drain regions without regard to the design rules, thereby improving the hot carrier injection efficiency at low power. As a result, it is possible to improve the speed of programming and erasing operations of the flash memory device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a flash memory device comprising:
   forming a sacrificial insulating pattern layer corresponding to a flash memory channel region in a semiconductor substrate;
   coating a photoresist layer on an entire surface of the semiconductor substrate and selectively patterning the photoresist layer;
   forming source and drain regions in the semiconductor substrate by ion implantation using the sacrificial insulating pattern layer and the photoresist layer as a mask;
   removing the sacrificial insulating pattern layer and the photoresist layer to expose an entire surface of the semiconductor substrate;
   sequentially forming a gate dielectric layer and a gate material layer on the entire exposed surface of the semiconductor substrate having source and drain regions formed therein, the gate dielectric layer comprising an ONO structure;
   forming a gate in the channel region by selectively etching the gate material layer and at least part of the gate dielectric layer; and
   forming gate sidewall spacers at sides of the gate.

2. The method of claim 1, further comprising, before forming the source and drain regions, forming an LDD region by ion implantation using the sacrificial insulating pattern layer as a mask.

3. The method of claim 2, wherein forming the LDD region comprises tilt-implanting low energy impurity ions.

4. The method of claim 1, wherein the respective steps of forming the sacrificial insulating pattern layer and forming the gate use the same mask.

5. The method of claim 1, wherein the step of forming the sacrificial insulating pattern layer includes:
   depositing an compound-type oxide layer having a thickness of from 2500 Å to 3000 Å by LPCVD; and
   selectively removing a portion of the compound-type oxide layer such that the sacrificial insulating pattern remains on the channel region.

6. The method of claim 1, wherein the sacrificial insulating pattern layer has a margin of 0.015~0.005 μm/side of the gate.

7. The method of claim 1, wherein the step of forming the gate dielectric layer includes:
   sequentially stoking a bottom oxide layer and a trap nitride layer on a surface of the semiconductor substrate including the source and drain regions; and
   forming a top oxide layer by a thermal process using a furnace at a temperature between 800° C. and 850° C.

8. The method of claim 7, wherein the bottom oxide layer has a thickness of from 50 Å to 80 Å, the trap nitride layer has a thickness of from 100 Å to 150 Å, and the top oxide layer has a thickness of from 250 Å to 300 Å.

9. The method of claim 7, wherein forming the gate comprises selectively patterning the top oxide layer and the trap nitride layer.

10. The method of claim 9, wherein forming the gate comprises patterning the bottom oxide layer in alignment with the gate sidewall spacers.

11. The method of claim 1, further comprising, after forming the gate sidewall spacer, forming a metal silicide layer on an exposed surface of the gate and the source and drain regions.

12. The method of claim 1, further comprising, before forming the gate sidewall spacer, oxidizing the sides of the gate.

13. A method for fabricating a nonvolatile memory device comprising:
   forming a sacrificial insulating pattern layer corresponding to a flash memory channel region in a semiconductor substrate using a gate mask;
   coating a photoresist layer on an entire surface of the semiconductor substrate and selectively patterning the photoresist layer;
   forming an LDD region in the semiconductor substrate by ion implantation using the sacrificial insulating pattern layer and the photoresist layer as a mask;
   removing the sacrificial insulating pattern layer and the photoresist layer to expose an entire surface of the semiconductor substrate;
   forming a gate and storage layer in the channel region on the entire exposed surface of the semiconductor substrate having the LDD region formed therein using the gate mask, the storage layer comprising an ONO structure; and
   forming a gate in the channel region by selectively etching the gate material layer and the storage layer.

14. The method of claim 13, wherein forming the LDD region comprises tilt-implanting low energy impurity ions.

15. The method of claim 13, wherein forming the gate and storage layer comprises sequentially forming a gate dielectric layer and a gate material layer, the gate dielectric layer comprising the ONO structure.

16. The method of claim 13, further comprising forming source and drain regions in the semiconductor substrate by ion implantation using the gate as a mask.

17. The method of claim 13, further comprising forming source and drain regions in the semiconductor substrate by ion implantation using the sacrificial insulating pattern layer as a mask.

18. The method of claim 13, further comprising forming a gate sidewall spacer at the side of the gate.

19. The method of claim 13, wherein the step of forming the sacrificial insulating pattern layer includes:
   depositing an compound-type oxide layer at a thickness between 2500 Å and 3000 Å by LPCVD; and
   selectively removing a portion of the compound-type oxide layer such that the sacrificial insulating pattern remains on the channel region.

20. The method of claim 13, wherein the sacrificial insulating pattern layer has a margin of 0.015~0.005 μm/side of the gate.

21. The method of claim 13, wherein the step of forming the gate dielectric layer includes:
   forming a bottom oxide layer having a thickness of from 50 Å to 80 Å;
   forming a trap nitride layer on the bottom oxide layer, the trap nitride layer having a thickness of from 100 Å to 150 Å; and
   forming a top oxide layer on the trap nitride layer, the top oxide layer having a thickness of from 250 Å to 300 Å.

22. The method of claim 21, further comprising patterning the bottom oxide layer in alignment with the gate sidewall spacers.

23. The method of claim 1, further comprising, before forming the sacrificial insulating pattern layer:
   forming a buffer oxide layer on the semiconductor substrate;
   forming a well in the semiconductor substrate by implanting ions through the buffer oxide layer; and
   controlling a threshold voltage by performing a channel ion implantation process and then removing the buffer oxide layer.

24. The method of claim 1, wherein the sacrificial insulating layer comprises an inorganic oxide.

25. The method of claim 1, wherein forming the gate sidewall spacers includes:

forming a gate side oxide layer by performing a gate sidewall oxidation process;

forming oxide and/or nitride layers on the entire surface of the semiconductor substrate by LPCVD;

forming the gate sidewall spacer by etching back the oxide and/or nitride layers and patterning the bottom oxide layer in the ONO structure using the gate and the gate sidewall spacer as a mask.

26. The method of claim 1, further comprising forming a silicide layer by depositing a refractory metal layer on the entire surface of the semiconductor substrate, performing a thermal silicidation process, and removing non-reacted refractory metal layer.

* * * * *